US009250705B2

(12) United States Patent
Richter

(10) Patent No.: US 9,250,705 B2
(45) Date of Patent: Feb. 2, 2016

(54) CAPACITIVE INPUT DEVICE WITH HAPTIC FEEDBACK

(75) Inventor: Wolfgang Richter, Starnberg (DE)

(73) Assignee: MICROCHIP TECHNOLOGY GERMANY GMBH, Rosenheim (DE)

( * ) Notice: Subject to any disclaimer, the term of this patent is extended or adjusted under 35 U.S.C. 154(b) by 1505 days.

(21) Appl. No.: 12/299,327

(22) PCT Filed: May 2, 2007

(86) PCT No.: PCT/EP2007/003907
§ 371 (c)(1),
(2), (4) Date: Sep. 17, 2009

(87) PCT Pub. No.: WO2007/124955
PCT Pub. Date: Nov. 8, 2007

(65) Prior Publication Data
US 2010/0044120 A1    Feb. 25, 2010

(30) Foreign Application Priority Data

May 1, 2006 (DE) .......................... 10 2006 019 954

(51) Int. Cl.
G06F 3/01      (2006.01)
G06F 3/044     (2006.01)
H03K 17/96     (2006.01)

(52) U.S. Cl.
CPC ............... *G06F 3/016* (2013.01); *G06F 3/044* (2013.01); *G06F 3/017* (2013.01); *H03K 17/962* (2013.01)

(58) Field of Classification Search
CPC .......... G06F 3/01; G06F 3/011; G06F 3/016; G06F 3/017; G06F 3/02; G06F 3/0227; G06F 3/0362; G06F 3/0416; G06F 3/044; G06F 3/0487; G06F 2203/04108; G06F 2203/0381; H03K 17/945; H03K 17/955; H03K 17/96; H03K 17/962

USPC ............. 345/156, 173–184; 700/83; 340/461; 701/36; 463/36–39; 715/701–702
See application file for complete search history.

(56) References Cited

U.S. PATENT DOCUMENTS 6,025,726 A * 2/2000 Gershenfeld et al. ......... 324/671
6,154,201 A * 11/2000 Levin et al. ................... 345/184
(Continued)

FOREIGN PATENT DOCUMENTS

WO    WO2006/042804    *  4/2006    ............... G06F 3/14

OTHER PUBLICATIONS

International Search Report and Written Opinion, Application No. PCT/EP2007/003907, 12 pages, Apr. 2, 2008.

*Primary Examiner* — Temesgh Ghebretinsae
*Assistant Examiner* — Keith Crawley
(74) *Attorney, Agent, or Firm* — Slayden Grubert Beard PLLC

(57) ABSTRACT

The invention relates to an input device for a user to perform switching, control and other input and selection operations. Input devices of this type are known in particular in the form of switches, sliders and touch screens on electrical equipment and other controls, e.g. in the vehicle field. The object of the invention is to create solutions that make it possible to create with a large degree of freedom of design an input interface that is advantageous for a user, particularly one that is easy to operate intuitively. This object is attained according to the invention with an input device for providing an input surface for generating switching, control and other input and selection operations, according to an input operation performed by a user, with at least one input organ for forming an input point provided for the generation of that signal, and an evaluation circuit for detecting the input operation performed by the user near the input point, wherein the input organ is embodied such that it supplies a haptic feedback, and the evaluation circuit defines a detection zone in which the input organ is located.

22 Claims, 9 Drawing Sheets

(56) References Cited

U.S. PATENT DOCUMENTS

| | | | |
|---|---|---|---|
| 6,509,892 B1 | 1/2003 | Cooper | 345/173 |
| 6,621,029 B2* | 9/2003 | Galmiche et al. | 200/600 |
| 7,489,303 B1* | 2/2009 | Pryor | 345/173 |
| 2001/0035815 A1* | 11/2001 | Fletcher et al. | 340/10.6 |
| 2002/0057020 A1* | 5/2002 | Caldwell | 307/112 |
| 2004/0056758 A1* | 3/2004 | Schwartz | 340/5.2 |
| 2005/0133347 A1* | 6/2005 | Hein | 200/5 R |
| 2005/0162411 A1 | 7/2005 | vanBerkel | 345/179 |
| 2006/0001649 A1* | 1/2006 | Rekimoto | 345/169 |
| 2006/0028453 A1* | 2/2006 | Kawabe | 345/173 |
| 2006/0161871 A1* | 7/2006 | Hotelling et al. | 715/863 |
| 2006/0214923 A1* | 9/2006 | Chiu et al. | 345/173 |
| 2007/0252729 A1 | 11/2007 | Li | 345/168 |
| 2009/0062938 A1* | 3/2009 | Breimesser et al. | 700/83 |

\* cited by examiner

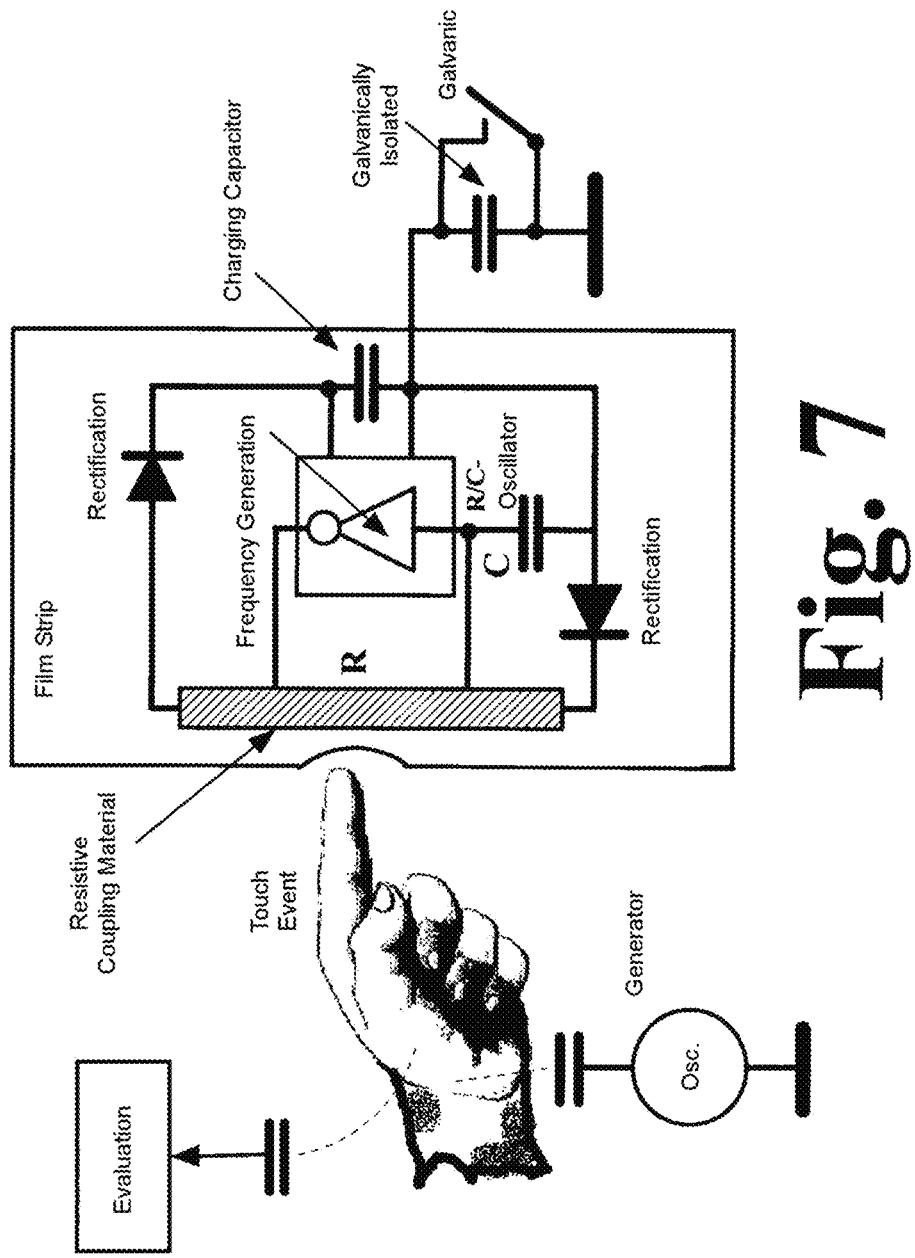

Fig. 8a

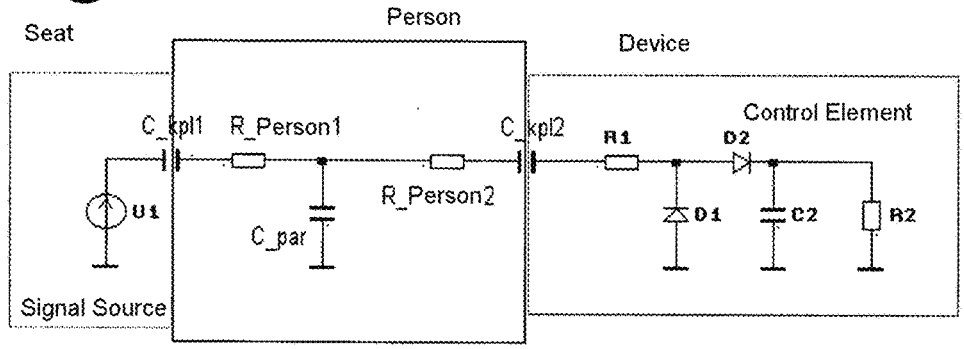

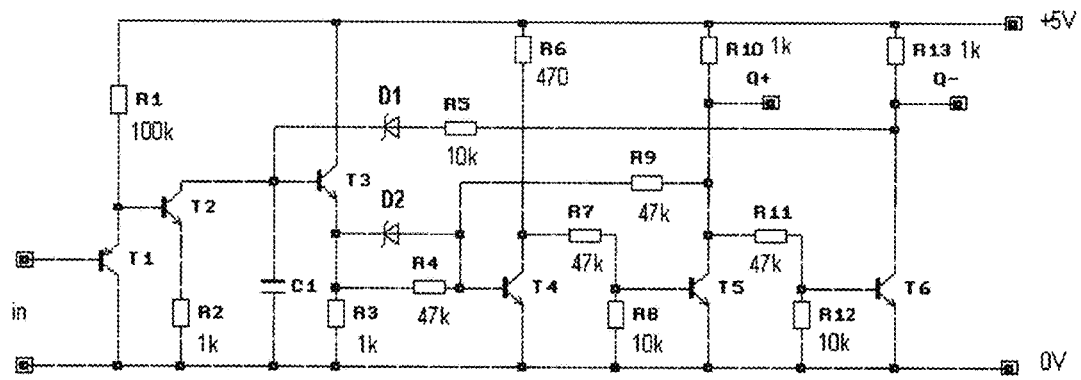

Level Conversion in
Astable Square-Wave Signal

Fig. 8b

T1, T2 – Power source that is controlled by the input voltage.
T4, T5 – Smitt triger (with T6 – inverting). The switching thresholds at the input of the emitter
follower T3 are approximatly U_on=1V, U_off=2V
C1 – The frequency disseminating condenser. In the first approach, the charging time t_1
is determined by the resistor R5 and the discharge time t_2 by the power source.
At the outputs Q+ and Q– a square-wave signal is present with the frequency and
touch ratio depending on the input voltage. Its period is T=t_1 + t_2, touch ratio t_1/T

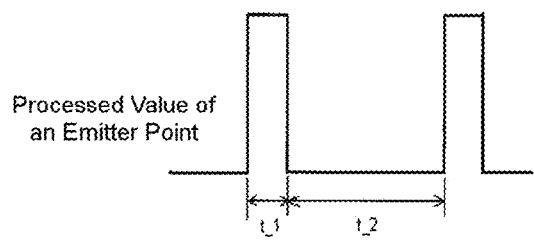

Fig. 8c

CAPACITIVE INPUT DEVICE WITH HAPTIC FEEDBACK

CROSS REFERENCE TO RELATED APPLICATIONS

This application is the U.S. national phase of PCT application PCT/EP2007/003907, filed 2 May 2007, published 8 Nov. 2007 as WO2007/124955, and claiming the priority of German patent application Ser. No. 102006019954.5 itself filed 1 May 2006, whose entire disclosures are herewith incorporated by reference.

The invention relates to an input device for a user to perform switching, control and other input and selection operations.

Input devices of this type are provided in particular in the form of switches, sliders and touch screens on electrical equipment and other controls, e.g. in the vehicle field.

Those touch screens come from the trend toward flexible machine/equipment operation. In the use of touch screens, "virtual keys" are shown on a computer screen and can be activated by an operator by tapping. The form as well as the position of the keys and their actuation functions can be programmed by software. Switching or selection operations can hereby be identified for the user by synthetically generated sounds.

The object of the invention is to create solutions that make it possible to create with a large degree of freedom of design an input interface that is advantageous for a user, particularly one that is easy to operate intuitively.

This object is attained according to the invention by an input device with the features given in patent claim 1.

It is thus advantageously possible to design the configuration of the input structures and the arrangement thereof relative to one another in line with requirements, without special alterations in the structure of the interconnection having to be made to this end. It is in particular possible hereby to create the most diverse variants of input surfaces with the use of a basic circuit embodied as a standard component. It is hereby possible to react to current design trends with short product development times.

The circumstance is hereby taken into account in an advantageous manner that in the evolution of humankind, in particular the sense of touch has also been formed in special way, namely such that the hands and fingers (controlled by a major part of the human brain) make it possible to determine and experience daily life. The as such "active person" can "grasp" his environment and the objects with which he deals in the truest sense of the word. With machines and equipment that can be controlled electrically and electronically, therefore an appealing haptic experience can be advantageously realized in addition to the switch function with the control elements according to the invention.

For example, tests in sales areas have shown that touch-screen systems with screens for product information are accepted by consumers only to a limited extent. The circumstance that a client would rather touch the product than obtain information thereon in a simulated experience field can be taken into account to a special extent through the concept according to the invention. The degree of flexibility promised by simulated key arrangements is still maintained thereby. Keys and switches, rotating elements according to the invention, in contrast to the previous concepts, no longer need to be wired in a complex manner and supplied with power and often operated from outside, e.g. through a housing plate, inward, e.g. to an electronic printed circuit board. Through holes, which often need to be made water-tight (etc.), can be omitted with the use of the concept according to the invention.

The concept according to the invention makes it possible to provide keys and other control elements in a real physical specification, and to design and to operate them flexibly in a similar manner to touch systems. Without their disadvantages, the desire for a haptic actuating experience is taken into account in a particularly advantageous manner.

Preferably at least one key or switch or other control element is mounted on the outside on a control panel accessible by a user. The electronics inside the device to be operated connect this key to a detection zone. When the key is actuated by the operator, in the area of the detection zone states are changed such that this can be determined in a defined manner as a switching operation, in particular key actuation. A suitable evaluation circuit can thereupon perform provided functions.

The invention represents alternatives for all known, touchable and wired control elements, such as, e.g. keys, switches, rocker switches, slide switches and slide controls, rotary switches or control knobs, dials, rotary knobs, steering wheels, touch pads, computer mice, etc.

According to one aspect of the invention, the keys can be illuminated by the same (or different) source(s), in order, e.g. to be able to indicate operating states (on—off, position, etc.). The control elements are thereby able to carry out at least one sensory function, e.g. measuring the actuation force or holding force exerted, e.g. by an operator. Electric (or electromagnetic) fields inside the control area, starting from field emitters (field points), perform an electrical interaction among one another or after one another. A first control element according to the invention attached within such fields after its attachment has a usually differing spatial distance from that one of these field points, the point charges of electrical fields of which can be picked up, transmitted, emitted or collected.

Further details and features of the invention result from the description below in connection with the drawing. Therein:

Figure 3:
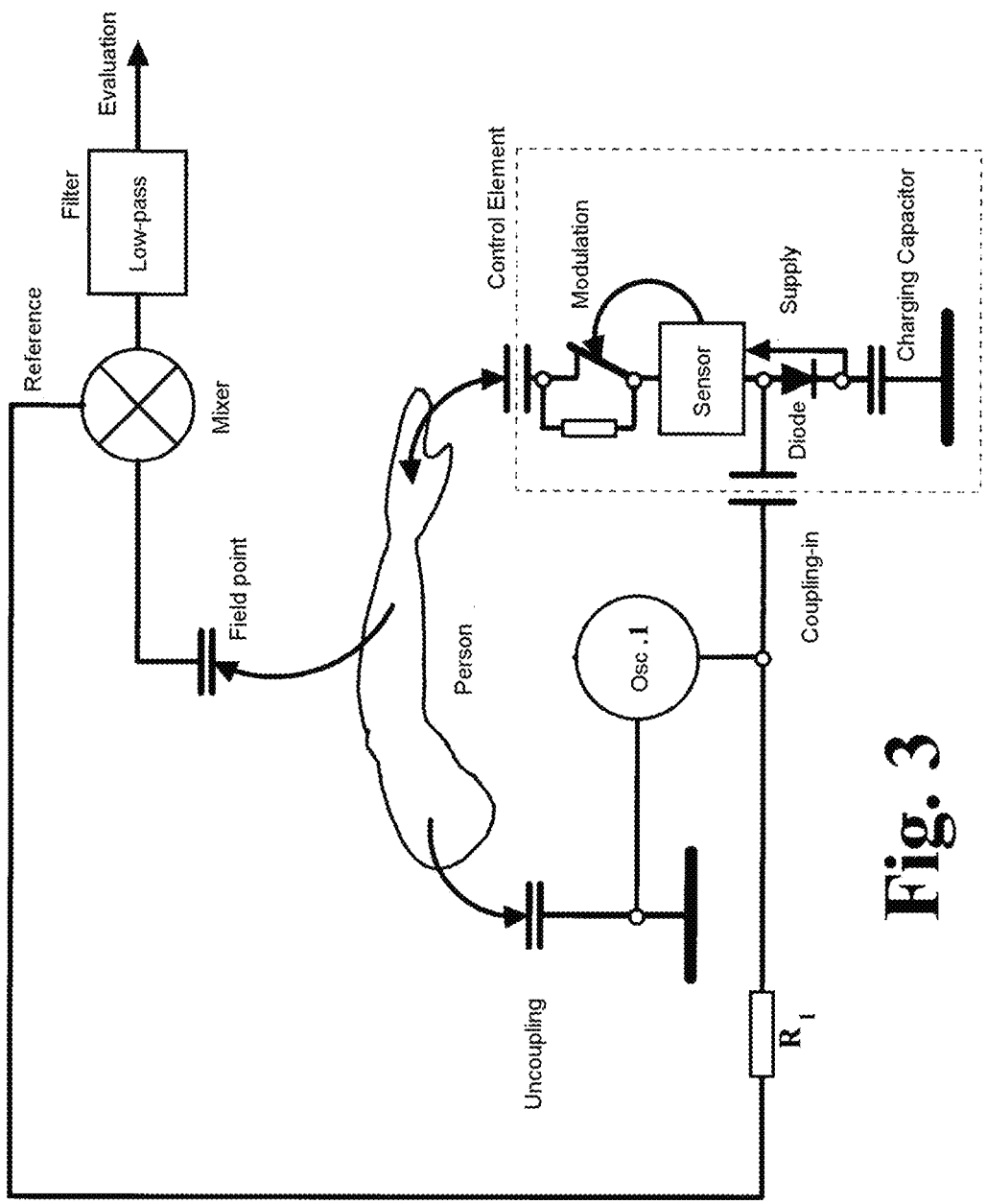
Figure 4:
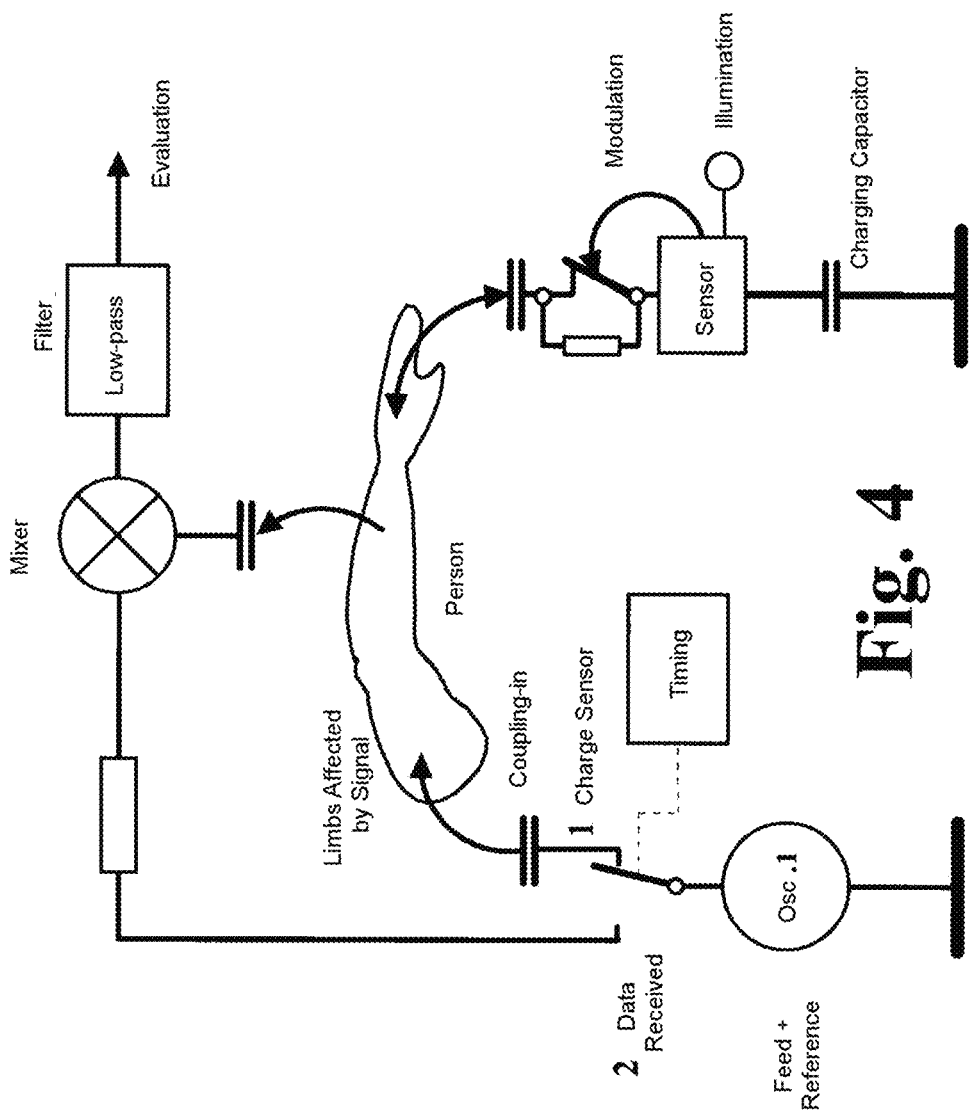
Figure 5:
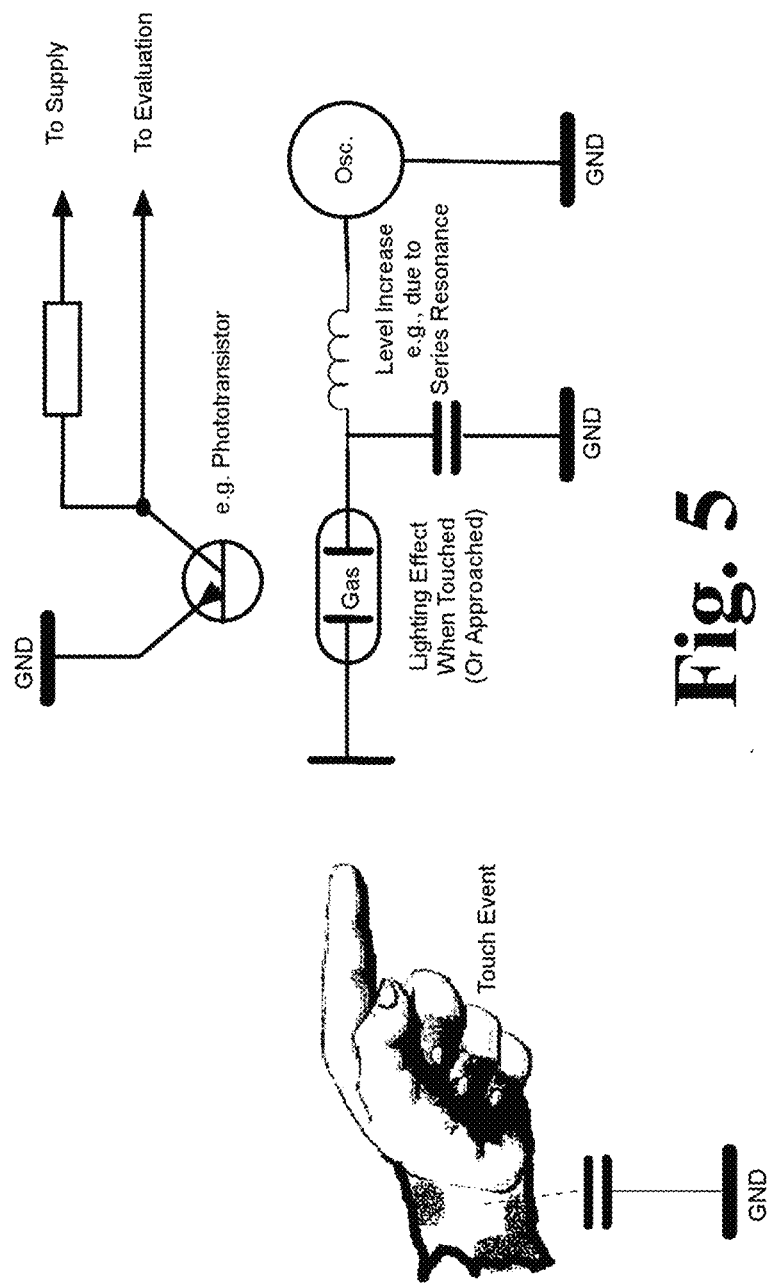
Figure 6:
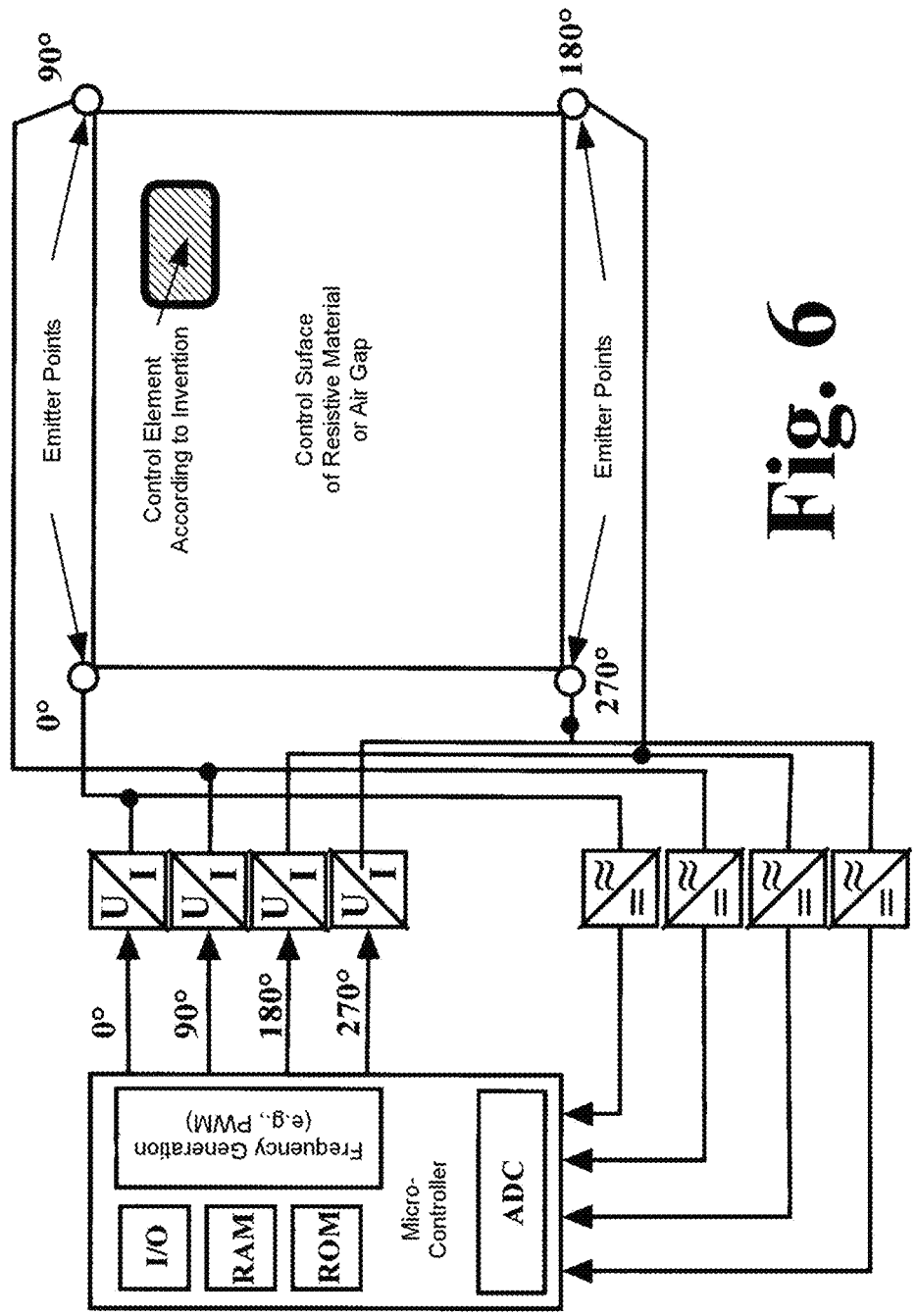
Figure 9:
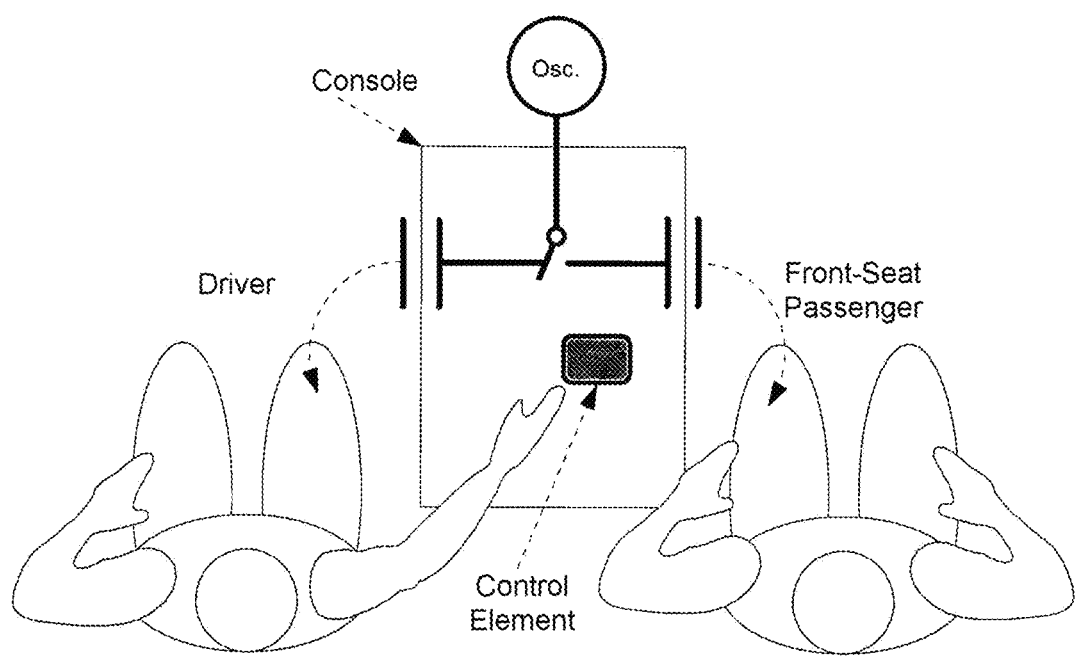

FIG. 3 is a further diagram showing the structure of a system according to the invention for generating switching commands using wireless capacitively detected control elements, in which the user forms a bridge between a field source and an output point, the electrical transmission properties of the user being changed via the control element selectively actuated thereby, so that the electrical events applied to the user supply information on the input processes performed in interaction with the control element;

FIG. 4 is another diagram showing the structure of a system according to the invention similar to FIG. 3 in which optical effects are generated in the area of the control element in that the electric power necessary for this purpose is obtained from the electrical events applied to the user and passed by this user into the area of the control element;

FIG. 5 is another diagram showing the structure of a system according to the invention similar to FIGS. 3 and 4, in which a haptic event is generated within the scope of actuation of the control element;

FIG. 6 is a diagram showing the structure of a system according to the invention in which position information in the two-dimensional range can be obtained via the control element;

FIG. 7 is a diagram showing the structure of a system according to the invention in which position information in the one-dimensional range can be obtained via the control element;

FIGS. 8a, 8b and 8c are diagrams showing the structure and mode of operation of a system according to the invention;

FIG. 9 is a diagram showing the use of the system according to the invention with a motor vehicle in which it can be established whether the control element is actuated by a driver or a front-seat passenger.

Figure 1:
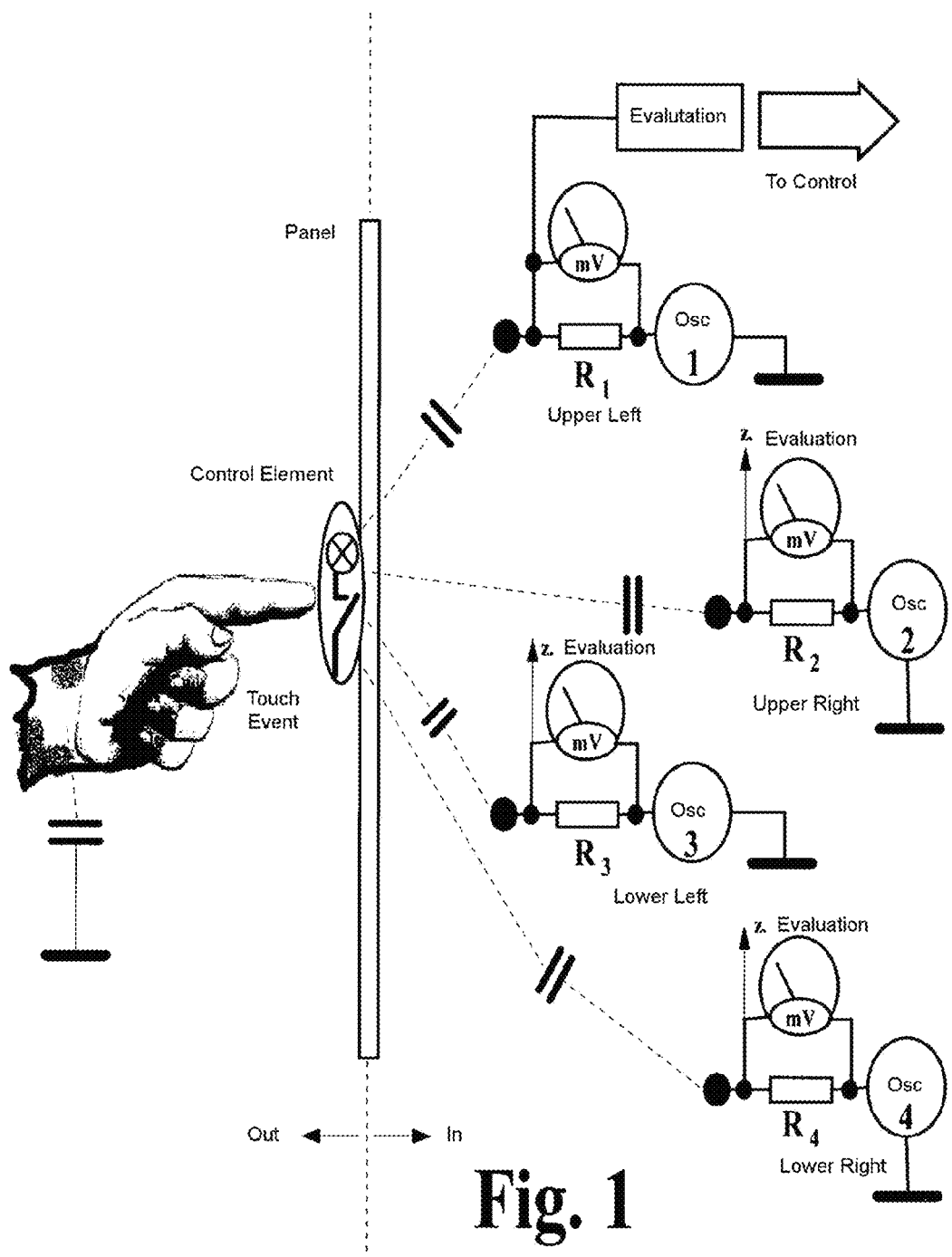
FIG. 1 is a diagram showing the structure of a system according to the invention for generating switching commands using wireless, capacitively detected control elements.

FIG. 1 is a diagram showing the structure of a system according to the invention for generating switching commands using wireless, capacitively recorded control elements. Due to differing voltage levels determined by the distance or different frequencies/phase positions, an electrical value that corresponds to its installation position can be assigned to a key of this type. This so-called "position value" can be transmitted to an evaluation system upon tactile actuation of the control element. This is carried out wirelessly via the properties of the electric (or electromagnetic) alternating field. According to the position transmitted, with the aid of a table (look-up table) an evaluation device can switch functions that can correspond directly to a key connected by wire.

Apart from the position value, in addition a function value or state value can also be transmitted.

Figure 2:
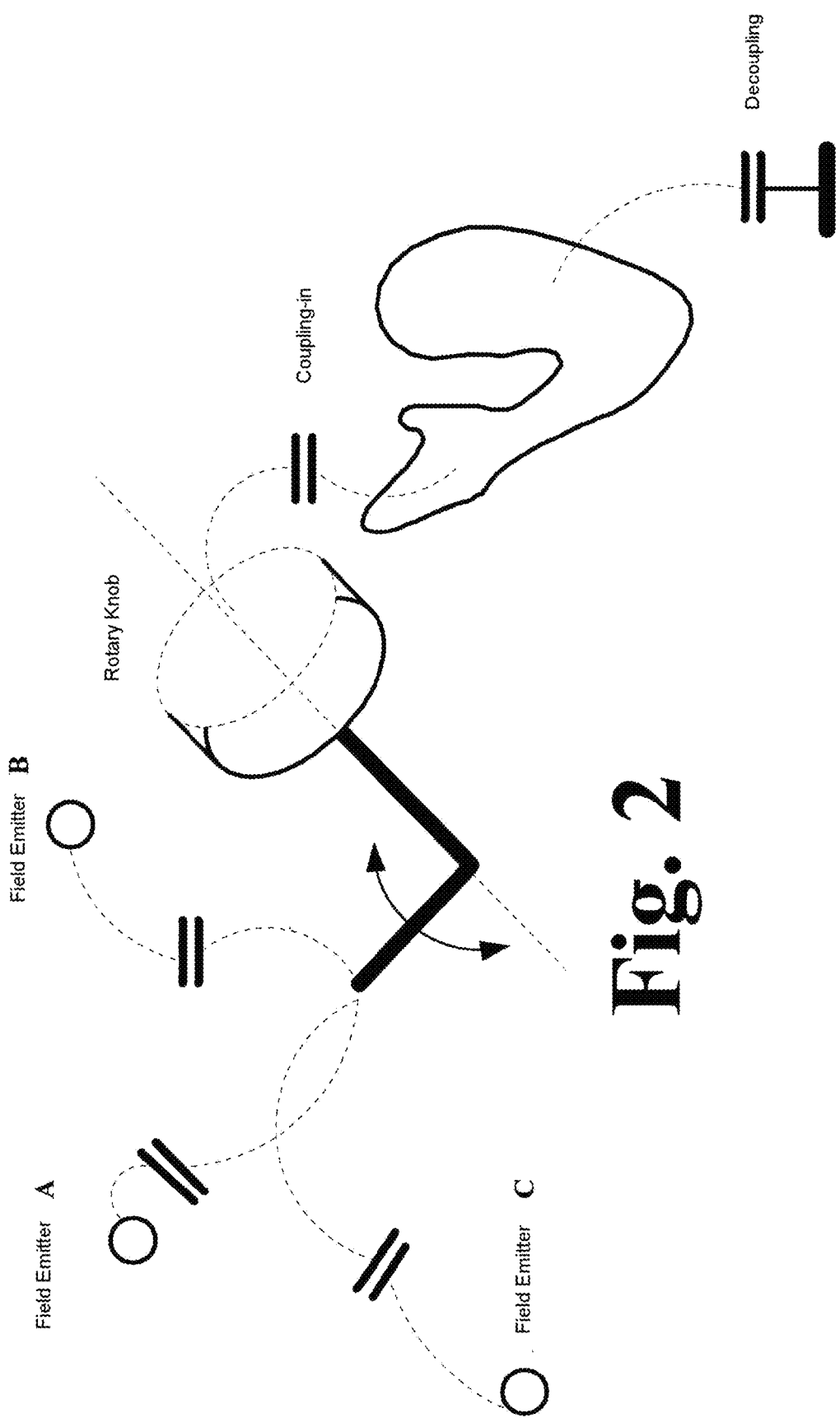
FIG. 2 is a diagram showing the structure of a system according to the invention in which in accordance with the rotary position of a rotary knob different electric-field events are fed a user so that the position of the rotary knob can be determined based on the electrical events fed to the user, or based on properties of an electrical system formed including the user.

As can be seen from FIG. 2, with rotary switches the current rotary position can be transmitted, in that the output point or input point for electrical (or electromagnetic) charges and fields is rotatably arranged on a coupling point (e.g. an "L" shaped metal pin) distant from the rotation axis, the surface of which points closer to at least one of the, for example, four emitter points (=measuring points) than to the others. The position of the rotary switch can be determined from the different signal levels and/or phase sequences.

The presence of the person is of particular importance, since on actuating a control element according to the invention he closes an AC voltage circuit to ground. Due to the physical properties (high-ohm) only the very low voltages flow, so that no harm can occur. However, these voltages are still sufficient to feed a current to the actuated control element and thus, for example, to charge a condenser so that an electronic system, for example, a signal generator or a sensor element or an lamp, possibly installed in the control element can be powered.

FIG. 3 is another diagram showing the structure of a system according to the invention for generating switching commands using wireless, capacitively recorded control elements where the user forms a bridge between a field source and an uncoupling point, the electrical transmission properties of the user are changed via the control element selectively actuated thereby such that the electrical events applied to the user supply information on the input operations performed in interaction with the control element. It is also possible to charge the control elements, e.g. connected to ground via an electric field and to provide this power at a control process or to use it for illumination purposes (also switching).

According to the variant shown in FIG. 4, a corresponding power transmission can be carried out via the conductive surface of the skin of a user that was acted on capacitively with an electric field.

As can be seen from FIG. 5, phenomena of photonics can be used for the invention, for example, such that when human limbs approach a control element, a gas contained therein begins to light up and this lighting effect initiates a triggering of an electronic processing circuit. (This effect is also visible, for example, with an electric AC voltage tester that is equipped for testing mains voltage with a resistor and a glow-discharge tube. The difference from the invention lies in that this uses a higher frequency and thus small proximity capacities and a distance from a control element can also already provide optical trigger effects.) The lighting effect can also be frequency-dependent.

First Embodiment

A first switch-like element is mounted on a control panel of a device, e.g. of plastic (or another dielectric) on the outside. This element contains in its interior elements that can simulate a haptic feedback (pressure points, clicker). Furthermore, the control element contains an input surface for electric alternating fields. These come from inside the device to be operated and are irradiated from various points, the position of which with respect to one another is known. The coupling surface of the first control element can record these fields but not (yet) transmit them. The transmission is carried out by a second coupling surface when a person touches this control element in order to deliberately trigger a switching operation (FIG. 1). On the one hand the fields are then differently attenuated, which depends on their spacing and their frequency to the control element according to the invention. In this manner the control element also "learns" its position. On the other hand, a part of this alternating field charge can be rectified and stored in an energy storage device (condenser, gold cup, storage battery, etc.) in order to be able to supply an electronic system contained in the control element. This electronic system can comprise, for example, i.a., a modulator that allows data to be modulated on the AC voltage circuit closed by the operator on actuating the control element (transponder principle). This data can thereby come from the control element itself, in order, e.g. to transmit an identification number or an operating state, or from a sensor assigned to the control element, which sensor can determine the values supplementing the operating state, e.g. actuating force or holding force of the operator.

Since Kirchhoff's laws apply in an AC voltage circuit, through a change in the impedance such as can be caused by the modulation device, for example, at another location a corresponding voltage drop (e.g. data telegram) can be observed, which voltage drop is fed to an evaluation device. According to the invention, conclusions can then be drawn from position signals, control signals and sensor signals in a processing device, which conclusions can be realized in the form of functions to be switched (feedback). Although this is actually a touch system, the operator believes he is initiating a switching function by haptic actuation of a key, a switch or a lever, etc. (with tactile feedback).

FIG. 1 shows a first possible circuit design. At the corner points of a control panel in the interior thereof four electrodes are acted on by oscillators in a high-ohmic manner with AC signals of different frequency or phase. These frequencies are emitted as electric alternating fields (so-called point charges) to the surroundings. Inside or outside these four electrodes also called charge points or "emitter points," a control element according to the invention can be located at a determinable position, which control element is attached to the outside of the control panel. Thus only a wireless capacitive charge coupling can take place. However, this takes place in a spherical space of the emitter points according to the invention, so that these can also be arranged relatively closely together. If the input capacitance of the control element were now grounded, each of the signals emitted by the emitter points would be capacitively loaded, the level of the load also depending on the distance from the respective emitter point. Along charge resistances (RF1 through R4) a change in the level is measurable, e.g. with the aid of a differential amplifier or a "differential ADC." This effect also occurs when, instead of the grounding, a person actuates this switch who has a certain ground capacity of a few hundred Pico farads. With the aid of a mathematical system according to the invention it is possible to transform the level differences into quotients in order to be able to factor out the level intensity so that different grounding conditions or body sizes do not lead to a falsification of the functions.

Inside the control element these level differences can be designed even more dramatically with resonance and/or absorption circuits or special filters in order to make the differentiation clearer.

It is also possible to operate an oscillator with the energy picked up with the control element therein, which oscillator in addition feeds a frequent, detectable (possibly data modulated) signal to the AC voltage circuit. This signal could also be emitted electromagnetically and received and processed by reading devices, such as are known from conventional transponder systems. The invention is thus suitable to correspond therewith in an advantageous manner. The development of tactile and practical experience values is a special feature of the invention. They lie in the embodiment and in the arrangement of the materials with respect to one another. For example, there can be cavities in the control element that upon actuation allow gases to escape or deflect liquids, etc. Pressure points, rather like omega springs with microswitches, can also snap in order to transfer this mechanical feeling to the finger nerves of the operator.

Further advantageous circuit designs

A microprocessor can provide at its outlets e.g. four-phase shifted signals (FIG. 6). The phase shift of the emitter electrodes corresponds to the bias angle of the diagonals (e.g. 90° with a square control panel), the current branching is therefore relatively constant in each panel element. FIG. 2.

This AC voltage is guided to field emitters via measurement resistors or a resistive touch area. It is possible to increase the level with the aid of series resonance circuits. An inserted capacitive load is generated, e.g. by a human finger that touches a control element according to the invention that can be at different distances from the emitters. Different capacitive loads are thus produced that can be measured during the respective phase of the relevant signal.

For example, the measurement can be carried out by a multichannel ADC present in the microprocessor, in order to thus realize a development according to the invention without major expenditure in terms of components. An additional input of the controller allows the signals emitted by the controlled element to be additionally received (switch positions, control forces, etc.)

Touch-fed sensory transponders can be produced, for example, on a flat polymer strip and, laid next to one another, attached to a motor vehicle steering wheel.

A driver can be impinged with an AC signal, the source of which, e.g. can come from the seat, the door trim, center console, foot well. When the steering wheel is touched capacitive couplings become active. The sensor strips according to the invention rectify the AC and with this energy switch on position-determining signal generators that are likewise located on the strip (e.g. in the form of polymer electronics). These signals can be evaluated at another location, it is also possible to transmit them via the skin of the driver (FIG. 2). The line AC voltage is then used as carrier frequency that is modulated through the sensor signal. The latter can also be changed through the manner (e.g. PWM, duty cycle, etc.) depending on how (and where) the driver handles the steering wheel in a tactile (haptic) manner (or even when he steers with his knees). FIG. 7 shows by way of example a circuit of a strip sensor with electronic system. After the rectification of the supply voltage, an RC oscillator is operated therewith (e.g. with Schmitt trigger inverter), the resistive and/or capacitive components thereof react to being grasped with a hand and to the haptic effects occurring thereby (e.g. holding force) with a resulting signal shape. FIG. 8a shows a possible supply electric circuit and FIG. 8b an evaluation electric circuit that emits the measured level as PWM (see FIG. 8c).

A control console in a motor vehicle can apply modulated distinguishable AC signals capacitively to the legs of the driver (left emitter) or front-seat passenger (right emitter) (FIG. 9). The signals can be different in frequency, phase or modulation. Control elements according to the invention are located on the console that, upon actuation, in addition to the position signal and/or the function value also transmit the AC signal identifying the operator to an evaluation device. Capacitive coupling locations in the console can pick up the signals and transmit them to decoding or evaluating devices. If it is to be determined only who is actuating the control elements (distinguishing between driver/front-seat passenger), these can also be conventionally wired and supplied. In this case, the impinged AC signal produced by the driver or front-seat passenger is evaluated in addition to the switching positions of the control elements.

Rotary switches according to the invention can have at least one coupling surface that is arranged offset from the rotation axis (FIG. 2). Depending on the rotational position (angle), the coupling surface is closer to some emitter points than to others. This means that the resulting position signal varies in a determinable manner depending on the switch position. The same applies to slide switches. The position signals preferably occur only when an operator closes or loads the AC voltage circuit by haptic actuation (touch)or applies an impinged AC voltage.

It is possible to insert luminescent substances (e.g. gases, neon, OLED, etc.) into the control elements according to the invention or into the control panel, which substances can optically display a switch setting/position (by lighting, flashing or glowing). When a hand approaches, these substances can change their brightness or color because the coupling capacity is greater. This also helps, e.g. to find a control element in the dark. The photonic effects can also be frequency-dependent. Through optical LCD filters, for example, luminescent paint lying underneath can also be visible or hidden. The light effects can also be used in the interior of a control panel, e.g. for triggering optoelectrical components. It is also possible to determine the position of the light spot in the interior of devices and to thereby identify a control element.

Control elements can also be designed as slide surfaces (controllers), e.g. by a resistive paint coat as coupling surface (or other flat resistive material). When stroked by a finger, position-determined voltage drops occur that can be evaluated according to the invention as controlled variables. The slide surfaces can be mounted inside or outside the control panel thereon. Depending on the embodiment, a one-dimensional, two-dimensional or three-dimensional operation is possible.

The control elements according to the invention can be applied to transparent materials and/or flat screens, which further increases the experience value.

Piezo effects can be additionally used according to the invention in the control elements in order to intensify position signals or control values or lighting effects.

The tactile control elements can also have a needle that, when actuated, pushes into the interior through a hole in the control panel and thus permits a stronger coupling-in of point (AC) charges. The control panel can thus be composed of metal, the conductivity of which can also be used.

It is also possible to increase the haptic experience value by using magnets in the control elements. They are used on the one hand for blocking and/or triggering blocked control elements, on the other hand a magnetically determined position measurement and function measurement is also possible.

The transmission of measured level shifts, frequency shifts or phase shifts to evaluation devices can be carried out in a digital or analog manner.

The evaluation device according to the invention can be suitable for distinguishing between the approach to a control element and the touching of a control element by an operator. The information generated by this distinction can be further taken into account in terms of switching technology.

It is possible to determine via the control elements whether the user is carrying a mobile communications device, in particular a WLAN capable mobile phone or in particular a mobile phone equipped with a Bluetooth system. A signal can be generated via the control element, which signal recognizes connection-relevant signals, in particular those specific to the mobile phone, and transmits them in a field-electric manner to a communication unit. Based on this concept, immediately after actuating the control elements, product-specific information or information determined by the purpose of the control element can be supplied to the user on his mobile phone, PDA, Blackberry, I-phone or the like.

The control elements can be embodied as low-cost circuits and mounted directly on the product packaging, a product display or an image carrier. The electrode structure provided for reading out the actuation information is preferably arranged such that an effective field bridging is achieved through the user.

The control element circuit according to the invention can act in particular as a subfunction assembly of a WLAN system and be used hereby through activities that can be intuitively safely mastered, e.g. touching a button signal arranged on package, to perform more complex signal operations and data transfer operations.

The above-mentioned low-cost circuit can be embodied in particular as a printed circuit that is located directly on the product or product packaging.

The invention claimed is:

1. An input arrangement for providing an input surface for generating at least one of a switching, a control and other input and selection signal, according to an input operation performed by a user hand, comprising:
   a control panel;
   at least one input device arranged within a detection zone and attached to the control panel thereby forming an operating element of the control panel and configured to receive the input operation wherein the at least one input device can be mechanically operated by the user hand thereby providing a haptic feedback when said input operation is performed,
   a field generator comprising a plurality of electrodes arranged at a distance from the at least one input device and each configured to generate an alternating electric field in the detection zone, wherein an electrical value from each electrode depends on a distance of an electrode to the input device;
   an evaluation circuit configured to detect the input operation by the user by analyzing changes in the alternating electric field caused by the user hand,
   wherein the evaluation circuit is configured to analyze the field electric changes at each electrode and to determine the location of the input device from the electrical values received from each electrode and to determine input commands corresponding to said input operation for generating said at least one of switching, control and other input and selection signal.

2. The input arrangement according to claim 1 wherein four electrodes are arranged in corners of the control panel.

3. The input arrangement according to claim 1 wherein a movement sequence of the user hand is analyzed and input commands are derived from the movement sequence.

4. The input arrangement according to claim 1 wherein each electrode receives an alternating signal from an oscillator with a different frequency or phase.

5. The input arrangement according to claim 1 wherein the evaluation circuit comprises a capacitive measurement system for determining a signal level influenced by penetration by the user hand into the detection zone, and wherein level changes are detected and evaluated by generating a pulse width modulated signal.

6. The input arrangement according to claim 1 wherein in interaction with the evaluation circuit there are contactless control elements arranged in the input device.

7. The input arrangement according to claim 1 wherein an identification specific to the input device or several input devices and established by the mounting position of the input device is detected via the evaluation circuit.

8. The input arrangement according to claim 1 wherein the touching of the input device by the user is detected by the evaluation circuit and taken into account in the generation of the switching signal.

9. The input arrangement according to claim 1 wherein depending on actuation, in particular switch position, the input device transmits a function value.

10. The input arrangement according to claim 1 wherein the input device is supplied with power in a contactless manner.

11. The input arrangement according to claim 1 wherein the input device can take over force or temperature measurement.

12. The input arrangement according to claim 1 wherein the input device have haptic properties selected from the group consisting of snapping, mechanical resistances, and sounds.

13. The input arrangement according to claim 1 wherein the input device obtains via electric fields power for illumination.

14. The input arrangement according to claim 1 wherein, when approached or touched, the input device can initiate optical trigger effects.

15. The input arrangement according to claim 1, comprising a plurality of input devices arranged on said panel, wherein the evaluation circuit determines an input device by its location.

16. The input arrangement according to claim 15 wherein the input arrangement is part of a household device.

17. A vehicle cockpit with an input arrangement according to claim 1.

18. The vehicle cockpit according to claim 17 wherein a seat adjustment, a mirror adjustment, a ventilation nozzle adjustment, an audio/video adjustment and/or a navigation system adjustment can be performed via input devices.

19. The vehicle cockpit according to claim 18 wherein it comprises a display device, and wherein the switching operation or a switch option that can be triggered by the input device is visualized via the display device.

20. The vehicle cockpit according to claim 19 wherein a distinction among the occupants is carried out and the switching command assignment is carried out for the respective occupant.

21. The vehicle cockpit according to claim 20 wherein the distinction of occupants is carried out when a hand of the respective occupant approaches based on the detected path.

22. An input arrangement for providing an input surface for generating at least one of a switching, a control and other input and selection signal, according to an input operation performed by a user hand, comprising:
   a control panel;
   at least one input device arranged and attached to the control panel to form an operating element of the control panel and configured to receive the input operation, wherein the input device has no wired connection for providing any signal based on the input operation, wherein the at least one input device can be mechanically operated by the user hand thereby providing a haptic feedback when said input operation is performed,
   a field generator comprising a plurality of electrodes arranged at a distance from the at least one input device and each electrode being configured to generate an alternating electric field in a detection zone around said input device;
   an evaluation circuit detects the location of the input device and an input operation by the user by analyzing changes in the alternating electric field caused by the user hand,
   wherein field electric changes caused by a movement of the user hand within the detection zone are detected by the evaluation circuit, and wherein the evaluation circuit is configured to analyze the field electric changes and to determine input commands corresponding to said input operation for generating said at least one of switching, control and other input and selection signal.

* * * * *